United States Patent [19]

Sasaki et al.

[11] 4,441,169

[45] Apr. 3, 1984

[54] STATIC RANDOM ACCESS MEMORY HAVING A READ OUT CONTROL CIRCUIT CONNECTED TO A MEMORY CELL

[75] Inventors: Itsuo Sasaki, Kawasaki; Hiroaki Suzuki, Yokohama, both of Japan

[73] Assignee: Tokyo Shibaura Denki Kabushiki Kaisha, Kawasaki, Japan

[21] Appl. No.: 351,518

[22] Filed: Feb. 23, 1982

[30] Foreign Application Priority Data

Feb. 25, 1981 [JP] Japan .................................. 56-26361

[51] Int. Cl.$^3$ ........................ G11C 11/40; G11C 13/00
[52] U.S. Cl. ..................................... 365/190; 365/154
[58] Field of Search ......................... 365/190, 189, 154

[56] References Cited

U.S. PATENT DOCUMENTS 4,400,800  8/1983  Kurafuji .............................. 365/190

*Primary Examiner*—Terrell W. Fears
*Attorney, Agent, or Firm*—Oblon, Fisher, Spivak, McClelland & Maier

[57] ABSTRACT

A MOSFET random access memory having a memory cell, an independent write-in switching means and an independent read-out control circuit. The read-out control circuit includes a first MOS transistor controlled by the data stored in the memory cell and a second MOS transistor controlled by a read-out control signal. When the data stored in the memory cell is read out, charge flow between the memory cell and the data line is prevented which results in high reliability.

13 Claims, 9 Drawing Figures

STATIC RANDOM ACCESS MEMORY HAVING A READ OUT CONTROL CIRCUIT CONNECTED TO A MEMORY CELL

BACKGROUND OF THE INVENTION

1. Field of the Invention

This invention relates to a Static Random Access Memory (SRAM), and more particularly to an improved means for reading out data stored in memory cells.

2. Description of the Prior Art

In the prior art SRAM, as shown in FIG. 1, data is written into a memory cell (11) through a common switching transistor (17) controlled by address signals (A) ($\overline{A}$). The memory cell (11) includes a Flip-Flop circuit (14) which consists of inverter circuits (18) (19) in which an output signal of the inverter circuit (19) is fed back to the input of inverter circuit (18) at the input node (A).

In the memory, when the data stored in the memory cell (11) is read out of the memory cell (11), the data is changed because stray capacitance $C_1$ existing on a data line (13) is considerably larger than capacitance $C_2$ of memory cell (11). Namely, in case that the stored data is "0", node A is at a low level and bus line (13) is at a high level, electric charge on the data line (13) moves to node A, which causes the stored data to change. On the other hand, in case that stored data is "1", node A is at a high level and the bus line (13) is at a low level, electric charge on node A moves to the data line (13). The above described misbehavior is a fatal drawback in the prior art memory system.

SUMMARY OF THE INVENTION

Accordingly, an object of this invention is to provide a novel SRAM with high reliability.

Another object of this invention is to provide a SRAM in which electric charge flow between a data line and memory cell does not occur when the data is read out of the memory cell.

Yet another object of this invention is to provide a SRAM in which the number of control lines is decreased.

These and other objects are achieved according to this invention by providing a novel static random access memory including (a) a flip-flop circuit having a first inverter circuit with a first input node and a first output node, and a second inverter circuit with a second input node and a second output node, wherein the first output node is connected to the second input node and the second output node is connected to the first input node; (b) first and second power sources; (c) a data line having a voltage setting means; (d) a write in switching circuit connected between the data line and the first input node and forming a memory cell with the flip-flop circuit; and (e) a read out control circuit having first and second switching circuits connected in series between the first power source and the data line, wherein the first switching circuit means is controlled by data stored in the memory cell and the second switching circuit is controlled by an address read signal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
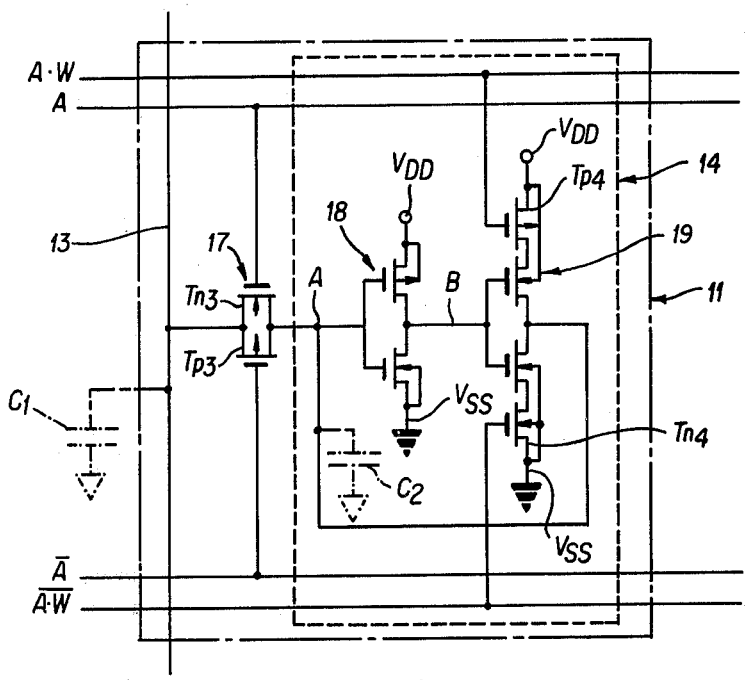
FIG. 1 is a circuit diagram of a prior art static random access memory.
Figure 2:
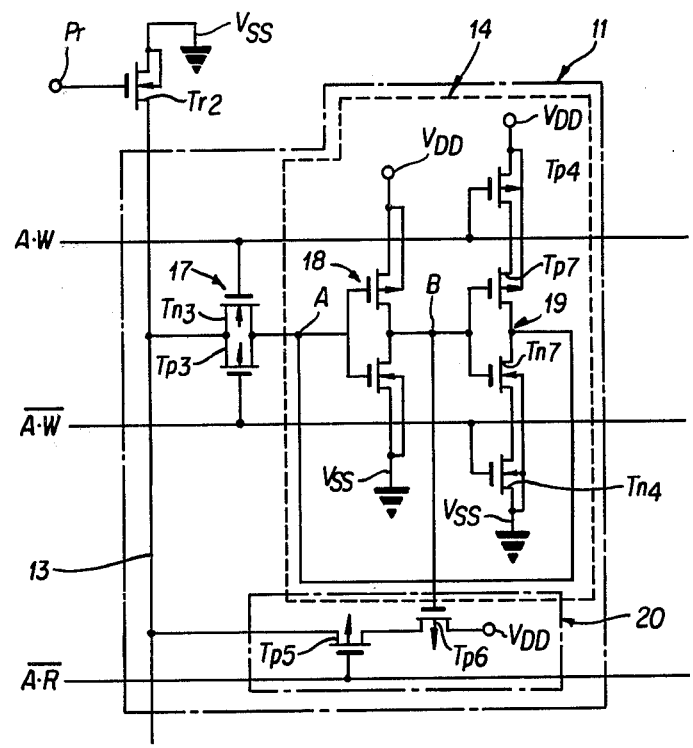
FIG. 2 is a circuit diagram of one embodiment of the SRAM according to the present invention.

Referring now to the drawings, wherein like reference numerals designate identical or corresponding parts throughout the several views, and more particularly to FIG. 2, thereof, there is shown a flip-flop circuit (14) constructed of a first inverter circuit (18) and a second inverter circuit (19). The output node of the first inverter circuit (18) is formed of P channel and N channel MOS transistors connected to the input node of the second inverter circuit (19) through node B. Furthermore the input node A is connected to the output node of the second inverter circuit (19). The second inverter circuit (19) is constructed as a clocked inverter circuit which includes an inverter circuit formed of one complementary pair of N channel and P channel MOS transistors $T_{p7}.T_{n7}$ and two switching transistors $T_{P4}$. $T_{B4}$ for controlling the inverter circuit upon receipt of complementary address write signals A.W, $\overline{A.W}$. The P channel transistor $T_{p4}$ is connected with P channel transistor $T_{p7}$ and the N channel transistor $T_{n4}$ is connected with N channel transistor $T_{n7}$. Write in switching circuit (17) is constructed of complementary transmission gate MOS transistors $T_{n3}.T_{p3}$. The source and drain electrodes of P channel MOS transistor $T_{p3}$ and N channel MOS transistor $T_{n3}$ are mutually connected and gate electrodes of MOS transistors $T_{n3}.T_{p3}$ are connected to complementary address lines A.W, $\overline{A.W}$ respectively. The channel of MOS transistors $T_{n3}.T_{p3}$ is connected with data line (13) and node A. A read out control circuit (20) consisting of P channel MOS transistors $T_{p5}.T_{p6}$ is connected between power source $V_{DD}$ and the data line (13). The gate electrodes of MOS transistors $T_{p5}.T_{p6}$ are respectively connected to an address read signal line $\overline{A.R}$ and to node B in the Flip-Flop circuit.

Data line (13) is connected to a second power source $V_{ss}$ through N channel MOS transistor $T_{r2}$ which is controlled by a precharge signal Pr. In this embodiment, one memory cell is constructed of flip-flop circuit (14), write in switching circuit (17) and read out control circuit (20).

Figure 3:
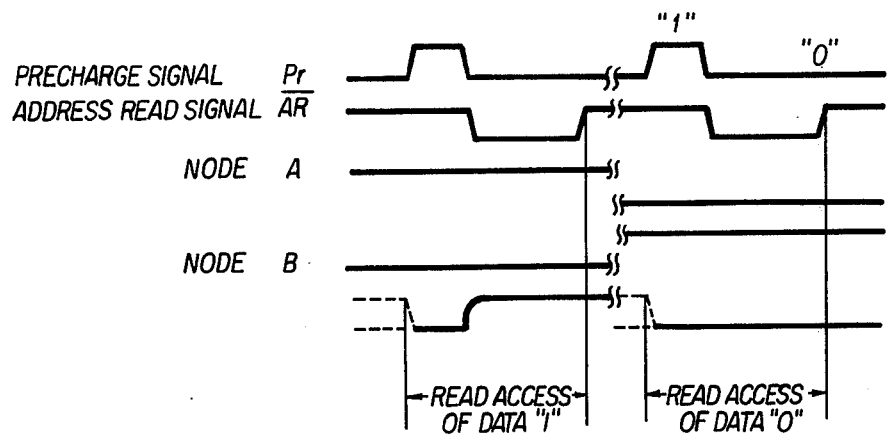
FIG. 3 is a timing diagram of the read out operation of the static random access memory shown in FIG. 3.

Nextly explained is the circuit operation of the circuit illustrated in FIG. 2 by reference to FIG. 3. When address signal A.W is low level (namely signal $\overline{A.W}$ is "high") and address read signal $\overline{A.R}$ is high level, write in switch circuit (17) is OFF and flip-flop circuit (14) composed of inverter circuits (18), (19) is separated from the data line (13). Therefore the data stored in the flip-flop circuit (14) is maintained. When data in the flip-flop circuit (14) is read out, only read out control circuit (20) works. Namely, write in switching circuit (17) cuts off the path between the data line (13) and the flip-flop circuit (14). At first, when precharge signal Pr is applied to the gate electrode of MOS transistor $T_{r2}$, the MOS transistor $T_{r2}$ is rendered conductive and the data line (13) is brought to the $V_{SS}$ level. Then address read out signal $\overline{A.R}$ becomes low level, which renders MOS transistor $T_{p5}$ conductive. If the stored data is "1" (namely node A is high level, node B is low level), transistor $T_{p6}$ is conductive. Accordingly, power source $V_{DD}$ is applied to the data line (13) through transistors $T_{p6}.T_{p5}$. By this operation the high level ("1") of node A is read out of memory cell (11). If the stored data is "0" (namely node A is low level, node B is high level), transistor $T_{p6}$ is nonconductive though the transistor $T_{p5}$ is conductive, therefore power source $V_{DD}$ is not applied to the data line (13). This means that the level of data line (13) is maintained at the $V_{SS}$ level set by the precharge MOS transistor $T_{r2}$ and that the low level "0" at node A is read out of memory cell (11).

According to the circuit, the stored data in the memory cell controls the MOS transistor $T_{p6}$, therefore charge current flow out of memory cell does not occur as it does in the conventional circuit.

When data is written into memory cell (11) out of data line (13), address write signal A.W becomes high level. ($\overline{A.W}$ becomes low level). Accordingly, the write-in switch circuit (17) is rendered conductive and the data is supplied to node A through switching circuit (17). At the time transistors $T_{p4}.T_{n4}$ are nonconductive, therefore the clocked inverter circuit (19) does not operate. That is to say, the momentary current path between the power source $V_{DD}$ of the inverter circuit (19) and the node A is not formed.

Figure 4:
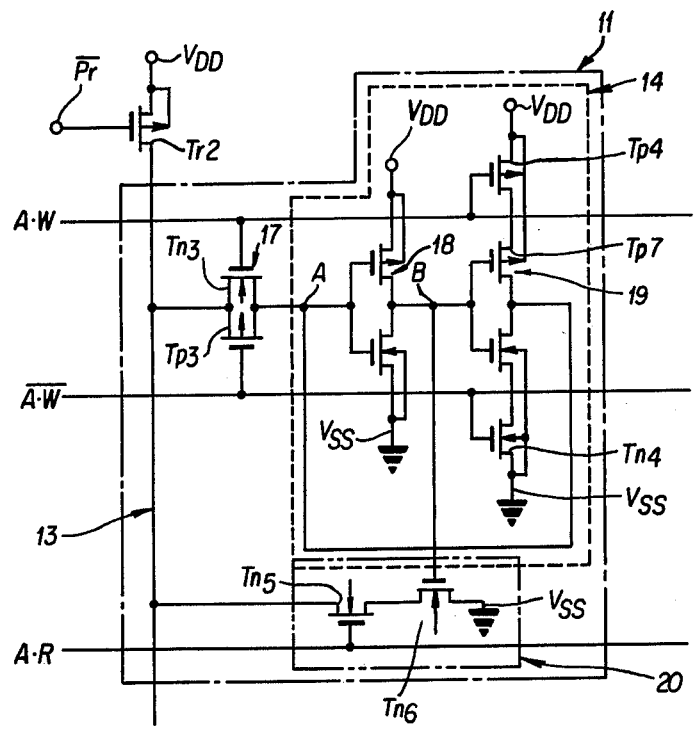
FIGS. 4 to 9 are circuit diagrams of other embodiments of the SRAM according to the present invention.

FIG. 4 shows a second embodiment according to this invention. The conductivity types of the MOS transistors $T_{n5}.T_{n6}$ of the read out control circuit (20) and the precharge MOS transistor $T_{r2}$ of enhancement mode are opposite to that of embodiment shown in FIG. 2. Data line (13) is connected to power source $V_{DD}$ through P channel MOS treansistor $T_{r2}$. Before the data is read out, the data line (13) is set at the $V_{DD}$ level by MOS transistor $T_{r2}$. On the other hand, the read out control circuit (20) is connected between the power source $V_{SS}$ and the data line (13). In this circuit, the same effect as that of FIG. 2 is obtained.

Figure 5:
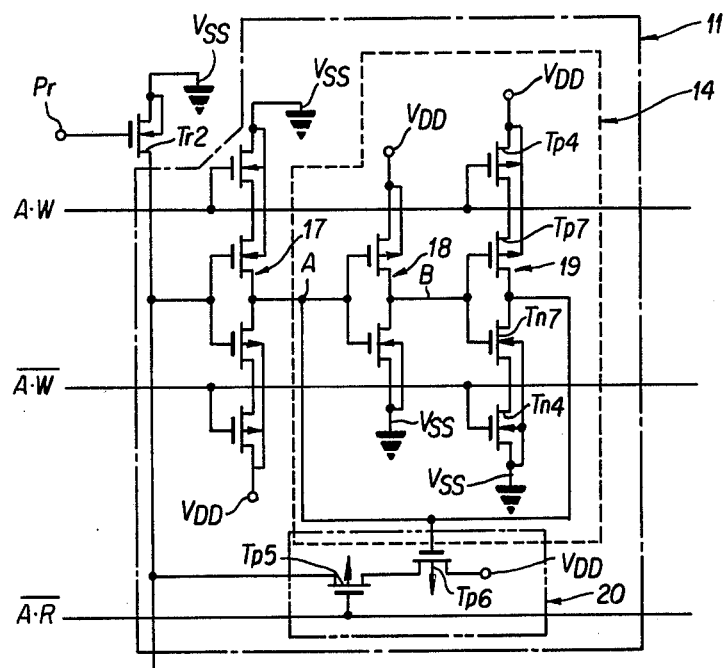

FIG. 5 shows a third embodiment according to this invention. A clocked inverter circuit (17) is employed as a write-in switching circuit. In this embodiment, the gate electrode of transistor $T_{p6}$ is connected to the node A, but is may be connected to node B. The conductivity types of MOS transistors $T_{p5}.T_{p6}$ and MOS transistor $T_{r2}$ are respectively P channel type and N channel type.

Figure 6:
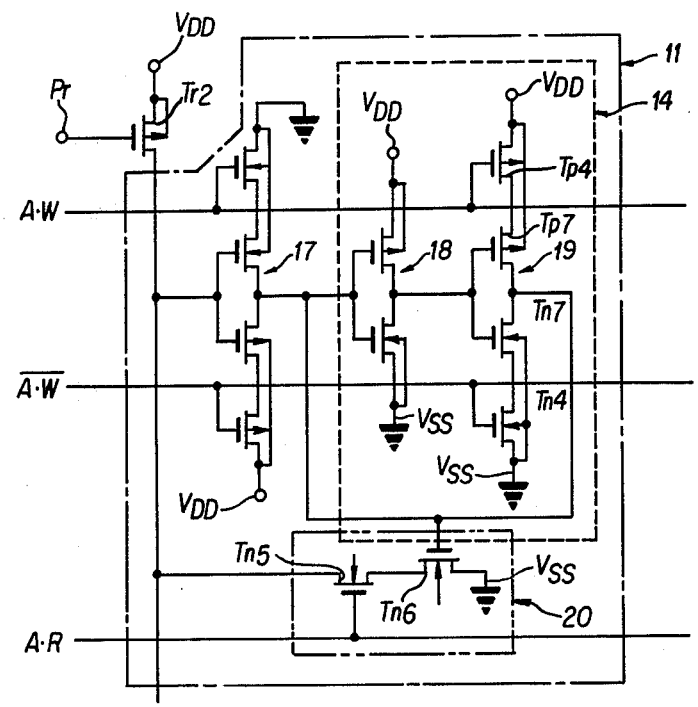

FIG. 6 shows a fourth embodiment according to this invention. The conductivity types of MOS transistors $T_{n5}.T_{n6}$ of the read out control circuit (20) and precharge MOS transistor $T_{r2}$ are opposite to that of the embodiment shown in FIG. 5.

Figure 7:
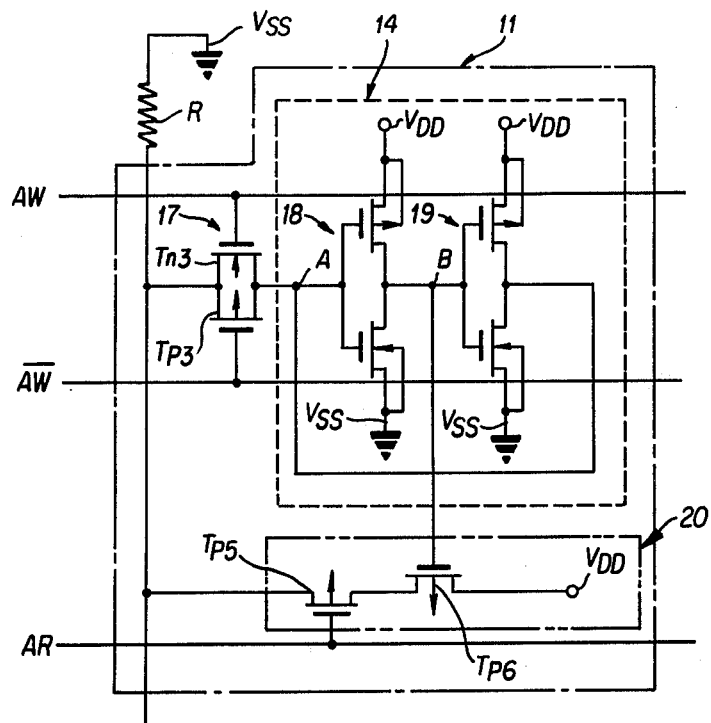

FIG. 7 shows a fifth embodiment according to this invention. A second inverter circuit (19) is the same type inverter circuit as the first inverter circuit (18) and a resistor R is employed as voltage setting means.

Figure 8:
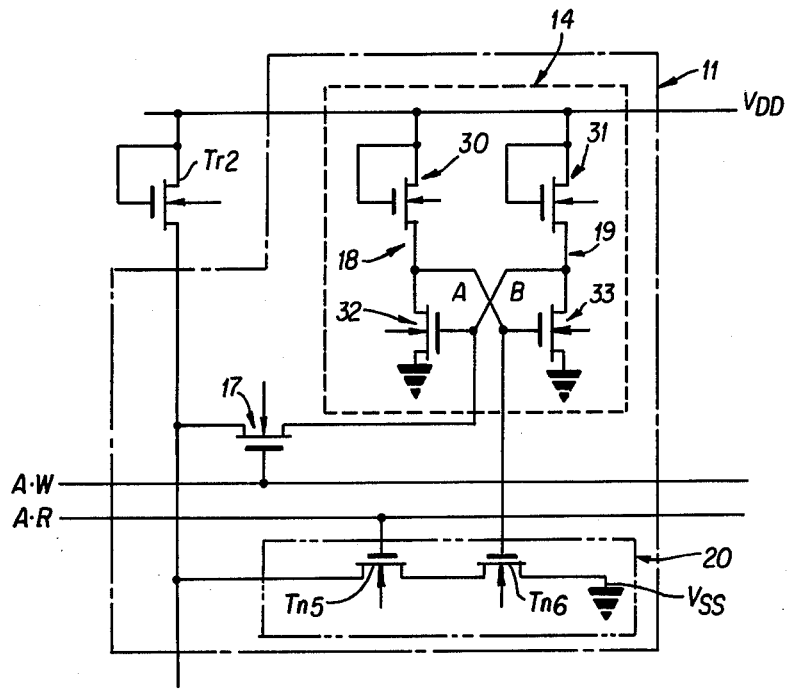

FIG. 8 shows a seventh embodiment according to this invention. In this embodiment flip-flop circuit (14) is constructed by two inverter circuits (18), (19) each formed of load MOS transistors (39) (31) and drive MOS transistors (32) (33). All MOS transistors employed in this circuit are N conductivity type.

Figure 9:
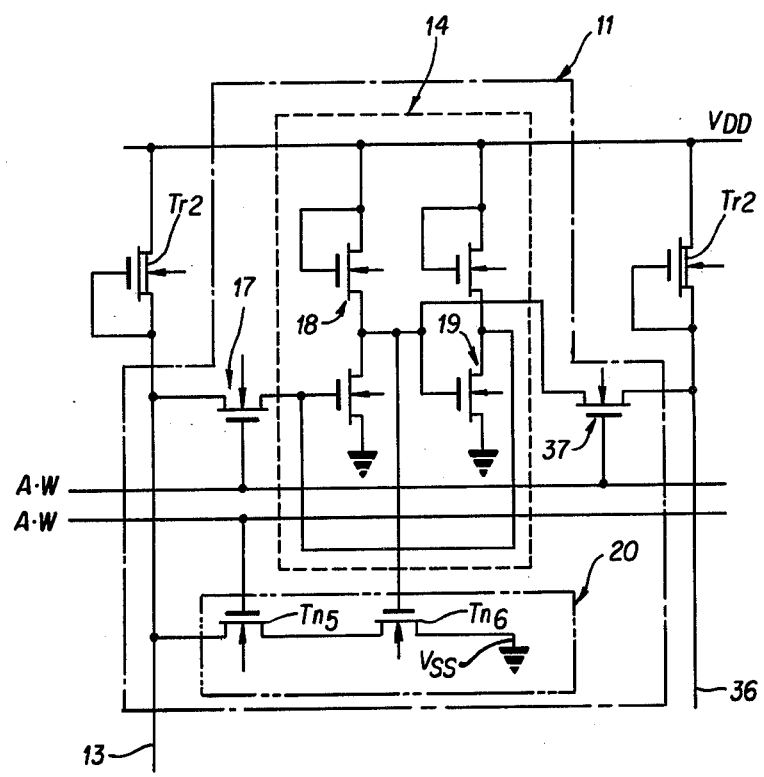

FIG. 9 shows an eighth embodiment according to this invention. In this embodiment another write-in switch circuit (37) and data line (36) are provided and depletion type MOS transistor $T_{r2}$ is employed as the voltage setting means.

According to this invention, a read-out control circuit controlled by data stored in the memory cell is provided for reading-out of memory cells. Therefore electric charge flow between the data bus line and the memory cell does not occur and high reliability is obtained.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A static Random Access Memory comprising:
   a flip-flop circuit having a first inverter circuit with a first input node and a first output node and a second inverter circuit with a second input node and second output node, said first output node being connected to the second input node and said second output node being connected to the first input node;
   a first power source and an address read line;
   a data line having a voltage setting means;
   a write-in switching means connected between the data line and the first input node for forming a memory cell with the flip-flop circuit; and
   a read-out control circuit having first and second switching means connected in series between the first power source and the data line, said first switching means controlled by data stored in the memory cell, said second switching means coupled to the address read line and controlled by an address read signal.

2. The static Random Access Memory according to claim 1, comprising:
   the first inverter circuit including one complementary pair of N channel type and P channel type MOS transistors, the gate electrodes of said MOS transistors mutually connected together to the first input node, the drain electrodes of said MOS transistors being connected together to the first output node;
   the second inverter circuit including one complementary pair of N channel type and P channel type MOS transistors, the gate electrodes of said MOS transistors mutually connected together to the first output node, the drain electrodes of said MOS transistors connected together to the second output node;
   the first switching means of the read-out control circuit formed of a first MOS transistor, the gate electrode of said first MOS transistor connected to the first output node; and,
   the second switching means of the read-out control circuit formed of a second MOS transistor, the gate electrode of said second MOS transistor connected to the address read line.

3. The static Random Access Memory according to claim 1, wherein the voltage setting means comprises a resistor element.

4. The static Random Access Memory according to claim 1, wherein the voltage setting means comprises a MOS transistor.

5. The static Random Access Memory according to claim 4, wherein the MOS transistor is of enhancement mode.

6. The static Random Access Memory according to claim 4, wherein the MOS transistor is of depletion mode.

7. The static Random Access Memory according to claim 4, wherein a control signal is applied to the gate electrode of the MOS transistor.

8. The static Random Access Memory according to claim 2 wherein the first and second MOS transistors are P channel type.

9. The static Random Access Memory according to claim 2 wherein the first and second MOS transistors are N channel type.

10. The static Random Access Memory according to claim 2, wherein the write-in switching means comprises:
   a clocked inverter circuit including an inverter circuit formed of one complementary pair of N and P channel MOS transistors and two switching MOS transistors for controlling said inverter circuit upon receipt of complementary address write signals, one of said switching MOS transistors being of N channel type and connected to the N channel MOS transistor of the inverter circuit and the other being of P channel type and connected to the P channel MOS transistor of the inverter circuit.

11. The static Random Access Memory according to claim 1, further comprising:
   a second power source and an address write signal line;
   the first inverter circuit including a first load element connected between the first power source and the first output node and a first MOS transistor with a first electrode connected to the output node, a second electrode connected to the second power source and a gate electrode connected to the first input node;
   the second inverter circuit including a second load element connected between the first power source and the second output node and a second MOS transistor with a first electrode connected to the second output node, a second electrode connected to the second power source and a gate electrode connected to the second input node;
   the write-in switching means formed of a third MOS transistor with a first electrode connected to the data line, a second electrode connected to the first input node and a gate electrode connected to the address write signal line; and
   the first and second switching means being MOS transistors having gate electrodes connected to the first output node of the first inverter circuit and to the address read signal line, respectively.

12. The static Random Access Memory according to claim 11, wherein the MOS transistors are of P channel type.

13. The static Random Access Memory according to claim 11, wherein the MOS transistors are of N channel type.

* * * * *